(12) United States Patent
Nagao et al.

(10) Patent No.: US 6,764,879 B2
(45) Date of Patent: Jul. 20, 2004

(54) SEMICONDUCTOR WAFER, SEMICONDUCTOR DEVICE, AND METHOD FOR MANUFACTURING THE SAME

(75) Inventors: Koichi Nagao, Kyoto (JP); Hiroaki Fujimoto, Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 10/200,950

(22) Filed: Jul. 24, 2002

(65) Prior Publication Data

US 2003/0032263 A1 Feb. 13, 2003

(30) Foreign Application Priority Data

Aug. 8, 2001 (JP) .................................. 2001-240845

(51) Int. Cl.[7] .............................................. H01L 21/48
(52) U.S. Cl. ......................... 438/110; 438/17; 438/14; 257/777; 257/784
(58) Field of Search ......................... 438/110, 14, 15, 438/17; 257/777, 784

(56) References Cited

U.S. PATENT DOCUMENTS 5,530,278 A   6/1996  Jedicka et al.
5,661,407 A * 8/1997  Shibata ........................ 324/763
6,573,113 B1 * 6/2003  Low et al. .................... 438/18
2002/0084512 A1   7/2002  Terada et al.

FOREIGN PATENT DOCUMENTS

| JP | 56-010943   | 2/1981  |
| JP | 02-144931   | 6/1990  |
| JP | 02-235356   | 9/1990  |
| JP | 08-306751   | 11/1996 |
| JP | 2000-236005 | 8/2000  |
| JP | 2002-033361 | 1/2002  |

* cited by examiner

Primary Examiner—Caridad Everhart
(74) Attorney, Agent, or Firm—McDermott, Will & Emery

(57) ABSTRACT

A semiconductor wafer of the present invention includes: a plurality of semiconductor chip areas each of which is to be a semiconductor chip; and a cut-off area for separating the plurality of semiconductor chip areas from one another so as to obtain the semiconductor chips, wherein: an integrated circuit and an electrode pad connected to the integrated circuit are provided in each of the semiconductor chip areas; and a probe pad connected to the electrode pad is provided in the cut-off area.

9 Claims, 11 Drawing Sheets

SEMICONDUCTOR WAFER, SEMICONDUCTOR DEVICE, AND METHOD FOR MANUFACTURING THE SAME

BACKGROUND OF THE INVENTION

The present invention relates to a COC (Chip On Chip) type semiconductor device in which two semiconductor chips, each including a semiconductor integrated circuit formed on the upper surface thereof, are attached together by flip chip bonding.

In recent years, various efforts have been made in the art to realize a lower cost, a smaller size and a higher performance (e.g., a higher speed, and a lower power consumption) for a semiconductor device including an integrated circuit. For example, a COC type semiconductor device has been proposed in the art, in which two semiconductor chips are attached together by flip chip bonding, the two semiconductor chips including LSIs of different functions or LSIs that are produced by different processes.

A conventional semiconductor device in which two semiconductor chips are attached together by flip chip bonding, and a method for manufacturing the same, will now be described.

FIG. 11A is a schematic diagram illustrating a semiconductor wafer having formed therein a plurality of semiconductor chip areas each of which is to be a semiconductor chip mounted on a conventional semiconductor device. FIG. 11B is a plan view illustrating the upper surface of the semiconductor wafer of FIG. 11A on an enlarged scale.

As illustrated in FIG. 11A and FIG. 11B, a plurality of semiconductor chip areas 2 are formed on a semiconductor wafer 1. The semiconductor chip areas 2 are partitioned from one another by a separation line 3, and a plurality of electrode pads 4 are formed in each of the semiconductor chip areas 2. The semiconductor chip areas 2 are cut off from one another along the separation line 3 into semiconductor chips that are each mounted on a conventional semiconductor device.

Each electrode pad 4 formed in a semiconductor chip area 2 is used as an external electrode pad for electrical connection to an external circuit in some cases, and as a probe pad for an electrical inspection of the semiconductor chip in other cases. Thus, each electrode pad functions both as an external electrode pad and as an inspection electrode pad. Note that only the electrode pads 4 are drawn in the semiconductor chip areas 2 in FIG. 11B, and other wires, etc., are not shown in the figure.

FIG. 12A is a schematic diagram illustrating a semiconductor chip 2a that has been cut out from the semiconductor wafer 1 and another semiconductor chip 5, which are to be provided in a conventional semiconductor device, and FIG. 12B is a cross-sectional view illustrating the conventional semiconductor device.

As illustrated in FIG. 12A and FIG. 12B, a bump electrode 6 formed on an electrode pad 8 and an external electrode pad 7 are formed on the upper surface of the semiconductor chip 5. Moreover, a bump electrode 9 is formed on an electrode pad 4 on the upper surface of the semiconductor chip 2a. In a conventional semiconductor device 200, the semiconductor chip 5 and the semiconductor chip 2a are attached together by flip chip bonding, with the bump electrode 6 and the bump electrode 9 being connected together. As illustrated in FIG. 12A, the semiconductor chip 2a is mounted on an area of the upper surface of the semiconductor chip 5 that is indicated by a broken line.

In the conventional semiconductor device 200, the space between the semiconductor chip 5 and the semiconductor chip 2a is filled with an insulative resin 10, as illustrated in FIG. 12B. Moreover, the semiconductor chip 5 is fixed on a die pad 11 of a lead frame. Furthermore, the external electrode pad 7 of the semiconductor chip 5 and an inner lead 12 of the lead frame are electrically connected to each other by a thin metal wire 13. The semiconductor chip 5, the semiconductor chip 2a, the die pad 11, the inner lead 12 and the thin metal wire 13 are encapsulated by an encapsulation resin 14.

Next, a method for manufacturing the conventional semiconductor device 200 will be described.

First, an insulative resin is applied on a central portion of the upper surface of the semiconductor chip 5. Then, the semiconductor chip 2a is pressed against the semiconductor chip 5, and the bump electrode 6 of the semiconductor chip 5 is connected to the bump electrode 9 of the semiconductor chip 2a. Note that the insulative resin may alternatively be injected into the space between the semiconductor chip 5 and the semiconductor chip 2a after they are connected together by flip chip bonding.

Then, after the external electrode pad 7 of the semiconductor chip 5 and the inner lead 12 of the lead frame are connected to each other by the thin metal wire 13, the semiconductor chip 2a, the semiconductor chip 5, the die pad 11, the inner lead 12 and the thin metal wire 13 are encapsulated by the encapsulation resin 14. Then, an outer lead of the lead frame protruding from the encapsulation resin 14 is shaped, thereby obtaining the semiconductor device 200.

However, with the conventional semiconductor device 200, the external electrode pad 7 to which the thin metal wire 13 is connected needs to be provided along the periphery of the semiconductor chip 5. In addition, the position at which the external electrode pad 7 is provided needs to be outside an area S on which the semiconductor chip 2a is to be mounted, as illustrated in FIG. 12A. Thus, the size of the semiconductor chip 5 needs to be larger than the size of the semiconductor chip 2a.

A possible way to reduce the size of the semiconductor device is to reduce the size of the semiconductor chip 2a and thus the size of the semiconductor chip 5. However, it is difficult to reduce the size of the semiconductor chip 2a for the following reason.

The semiconductor chip areas 2 formed on the semiconductor wafer 1 are electrically inspected by a probing process, and only non-defective semiconductor chip areas are picked up. Then, those semiconductor chip areas 2 that have been picked up are separated, thereby obtaining semiconductor chips 2a, each of which is attached to the semiconductor chip 5 by flip chip bonding.

A probe pad is required in order to perform an electrical inspection by a probing process, and some of the electrode pads 4 in each semiconductor chip area 2 (semiconductor chip 2a) are probe pads. A probe may slide after contacting the electrode pad 4 being a probe pad. Therefore, in order to ensure that the probe contacts the electrode pad 4 being a probe pad, the electrode pad 4 being a probe pad needs to be formed with a size larger than a square of 70 $\mu$m×70 $\mu$m. This necessarily increases the size of the semiconductor chip 2a. Thus, it is difficult to reduce the size of the semiconductor chip 2a.

Moreover, as semiconductor devices are provided with a higher performance (e.g., a higher speed, and a lower power consumption), the formation of a probe pad in the semiconductor chip area 2 (semiconductor chip 2a) makes non-negligible the influence of the capacitance, the inductance, etc., of each of the probe pad, the electrode pad, the protection circuit for the electrode pad, the bump electrode and the wire.

SUMMARY OF THE INVENTION

The present invention has been made to solve the problem in the prior art, and has an object to provide a semiconductor device having a small size and a high performance.

A semiconductor wafer of the present invention includes: a plurality of semiconductor chip areas each of which is to be a semiconductor chip; and a cut-off area for separating the plurality of semiconductor chip areas from one another so as to obtain the semiconductor chips, wherein: an integrated circuit and an electrode pad connected to the integrated circuit are provided in each of the semiconductor chip areas; and a probe pad connected to the electrode pad is provided in the cut-off area.

With the semiconductor wafer of the present invention, the semiconductor wafer is inspected by contacting a probe to the probe pad, after which the cut-off area having the probe pad, which is no longer needed after the inspection, is cut off and removed. Thus, the size of the semiconductor chip area to be the semiconductor chip is reduced. Therefore, according to the present invention, it is possible to obtain a semiconductor chip that is smaller than a semiconductor chip obtained from a conventional semiconductor wafer. Moreover, since the probe pad has been cut off and removed in the obtained semiconductor chip, it is not necessary to take into consideration the capacitance and the inductance of the probe pad. Therefore, the capacitance and the inductance of wires such as the electrode pad of the semiconductor chip of the present invention are smaller than those of the conventional semiconductor chip.

The number of electrode pads formed in each of the semiconductor chip areas may be larger than the number of probe pads connected to the electrode pads.

It is preferred that a pitch of the electrode pads formed in each of the semiconductor chip areas is smaller than a pitch of the probe pads connected to the electrode pads.

In this way, the shape of the probe pad can be elongated in the direction in which the probe is slid on the probe pad during the inspection. Thus, the inspection can be more reliable.

A size of the electrode pad formed in each of the semiconductor chip areas may be smaller than a size of the probe pad connected to the electrode pad.

The probe pads connected to the electrode pads may be formed along one, two or three sides of each of the semiconductor chip area.

A protection circuit for the probe pad may be provided in the cut-off area.

It is preferred that a wire connected to the electrode pad formed in each of the semiconductor chip areas is formed in a wiring layer that is below a wiring layer in which a wire connected to the probe pad is formed.

In this way, the wiring length from the internal circuit to the electrode pad can be reduced. Thus, the line capacitance can be reduced.

A semiconductor device of the present invention includes: a first semiconductor chip including a first integrated circuit, a first electrode pad connected to the first integrated circuit, and a first bump electrode formed on the first electrode pad; a second semiconductor chip including a second integrated circuit, a second electrode pad connected to the second integrated circuit, and a second bump electrode formed on the second electrode pad, wherein: a section of an inspection wire connected to the first electrode pad is exposed on a side surface of the first semiconductor chip; and the first bump electrode and the second bump electrode are electrically connected to each other.

With the semiconductor device of the present invention, the inspection wire, which is no longer needed after the inspection, is cut off and removed, and the area in which the inspection wire is provided is also removed. Thus, the size of the first semiconductor chip is smaller than that of a conventional semiconductor chip. Therefore, it is possible to obtain a semiconductor device that is smaller than a conventional semiconductor device. Moreover, since the inspection wire is cut off and removed from the first semiconductor chip, it is not necessary to take into consideration the capacitance and the inductance of the inspection wire. Therefore, the capacitance and the inductance of wires such as the electrode pad of the semiconductor device of the present invention are smaller than those of the conventional semiconductor device.

In the semiconductor device of the present invention, a probe pad may not be provided in the first semiconductor chip.

An external electrode pad for connection to an external circuit may be formed along a periphery of the second semiconductor chip.

An insulative resin may be provided between the first semiconductor chip and the second semiconductor chip.

The first semiconductor chip and the second semiconductor chip may be encapsulated by an encapsulation resin.

A method for manufacturing a semiconductor device of the present invention includes the steps of: (a) preparing a first semiconductor wafer, the first semiconductor wafer including: a plurality of first semiconductor chip areas each of which is to be a first semiconductor chip; and a cut-off area for separating the plurality of first semiconductor chip areas from one another so as to obtain the first semiconductor chips, wherein: a first integrated circuit and a first electrode pad connected to the first integrated circuit are provided in each of the first semiconductor chip areas; and a probe pad connected to the first electrode pad is provided in the cut-off area; (b) inspecting each of the first semiconductor chips by contacting a probe to the probe pad; (c) forming a first bump electrode on the first electrode pad; (d) removing the cut-off area of the first semiconductor wafer so as to obtain the first semiconductor chips from the first semiconductor chip areas; (e) preparing a second semiconductor wafer, the second semiconductor wafer including a plurality of second semiconductor chip areas each of which includes a second integrated circuit, and a second electrode pad connected to the second integrated circuit, and each of which is to be a second semiconductor chip; (f) forming a second bump electrode on the second electrode pad formed in each of the second semiconductor chip areas; (g) heating and pressing the first bump electrode and the second bump electrode against each other so as to electrically connect the first bump electrode and the second bump electrode to each other; and (h) cutting the second semiconductor wafer so as to separate the second semiconductor chip areas from one another.

With the method of the present invention, the probe pad, which is no longer needed after the inspection, is cut off and removed from the first semiconductor chip. Thus, the size of the first semiconductor chip is smaller than that of a conventional semiconductor chip. Therefore, it is possible to obtain a semiconductor device that is smaller than a conventional semiconductor device. Moreover, since the probe pad is cut off and removed from the first semiconductor chip, it is not necessary to take into consideration the capacitance and the inductance of the probe pad in the obtained semiconductor device. Therefore, according to the present invention, it is possible to obtain a semiconductor device in which the capacitance and the inductance of wires such as the electrode pad are smaller than those of the conventional semiconductor device.

In the step (g), an insulative resin may be supplied between the first semiconductor chip and the second semiconductor chip.

In the step (c) and the step (f), the first bump electrode and the second bump electrode may be formed by using one of an electroplating method, an electroless plating method, a printing method, a dipping method, and a stud bump method.

In the step (c), the first bump electrode may be made of one of an alloy containing tin and silver, an alloy containing tin and lead, tin, nickel, copper, indium, and gold.

DESCRIPTION OF THE PREFERRED EMBODIMENT

A semiconductor wafer in one embodiment of the present invention and a semiconductor device using the same will now be described with reference to the drawings.

Figure 1A:
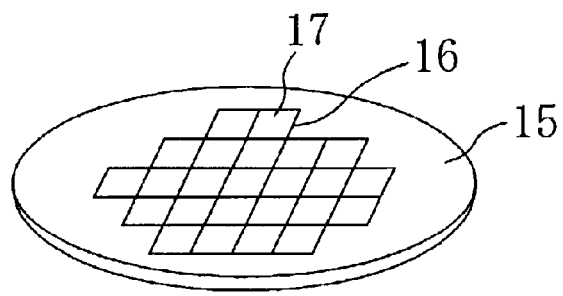
FIG. 1A is a schematic diagram illustrating a semiconductor wafer having formed therein a plurality of semiconductor chips.

First, the semiconductor wafer of the present embodiment will be described. FIG. 1A is a schematic diagram illustrating the semiconductor wafer having formed therein a plurality of semiconductor chip areas each of which is to be a semiconductor chip, and FIG. 1B is a plan view illustrating the upper surface of the semiconductor wafer of FIG. 1A on an enlarged scale.

Figure 1B:
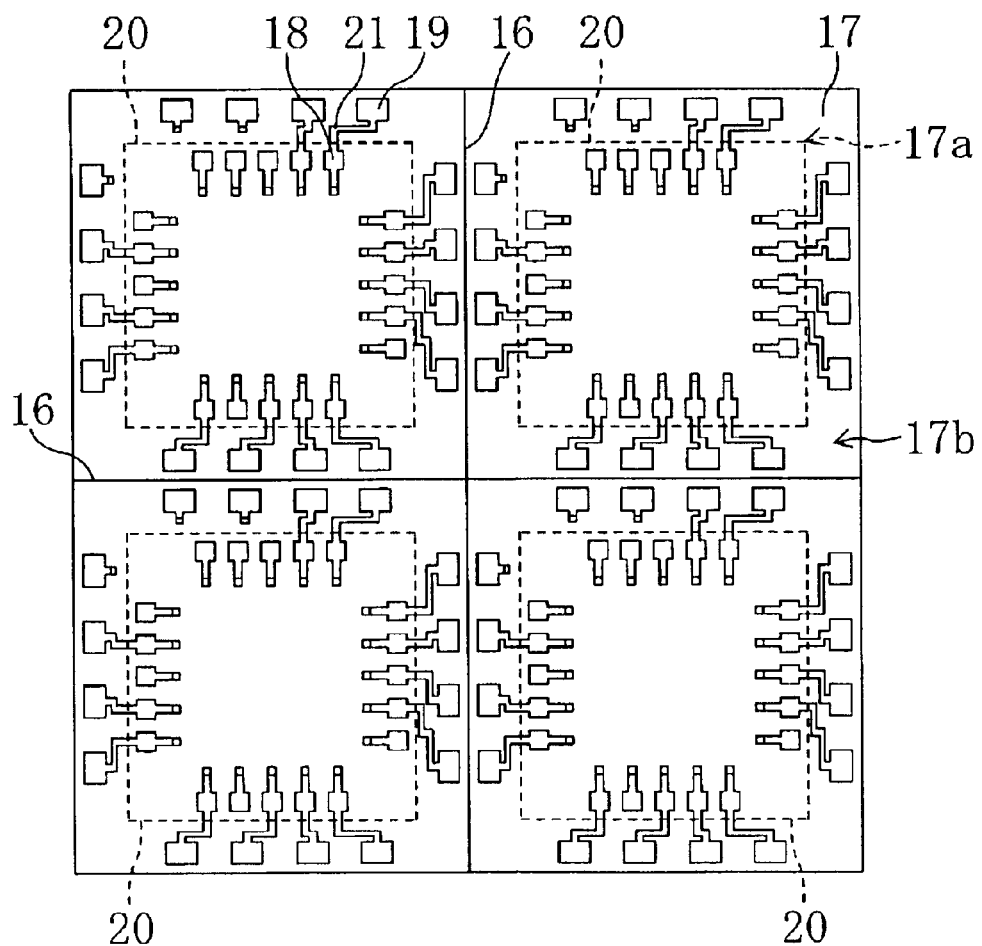
FIG. 1B is a plan view illustrating the upper surface of the semiconductor wafer of FIG. 1A on an enlarged scale.

As illustrated in FIG. 1A and FIG. 1B, a semiconductor wafer 15 of the present embodiment has formed therein a plurality of bulk chip areas 17 that are partitioned from one another by a first separation line 16. An integrated circuit (not shown), electrode pads 18 and probe pads 19 are formed in each of the bulk chip areas 17, and a second separation line 20 runs to separate the integrated circuit and the electrode pads 18 from the probe pads 19. The second separation line 20 is located inside the first separation line 16 on the surface of the bulk chip area 17, and separates the bulk chip area 17 into a semiconductor chip area 17a to be a semiconductor chip and a cut-off area 17b that is between the first separation line 16 and the second separation line 20. In other words, the bulk chip area 17 includes the semiconductor chip area 17a, which is located inside the second separation line 20 and which is to be a semiconductor chip, and the cut-off area 17b, which is between the first separation line 16 and the second separation line 20.

Note that the second separation line 20 is a line that is assumed herein for discussion purposes, and it is not actually formed on the semiconductor wafer 15. Moreover, while the second separation line 20 is a straight line in the present embodiment, it may of course be a curved line.

Some of the probe pads 19 are connected to the electrode pads 18 each via a wire 21 that runs across the second separation line 20.

The electrode pad 18 connects the semiconductor chip obtained from the semiconductor chip area 17a with an electrode pad of another semiconductor chip, and is provided for transferring signals at a high speed between the two semiconductor chips. Note that it is preferred that the electrode pad 18 is formed directly above a wire, a diffusion layer, etc., in the semiconductor chip area 17a so that the length of the wire to the electrode pad 18 is reduced.

Figure 2:
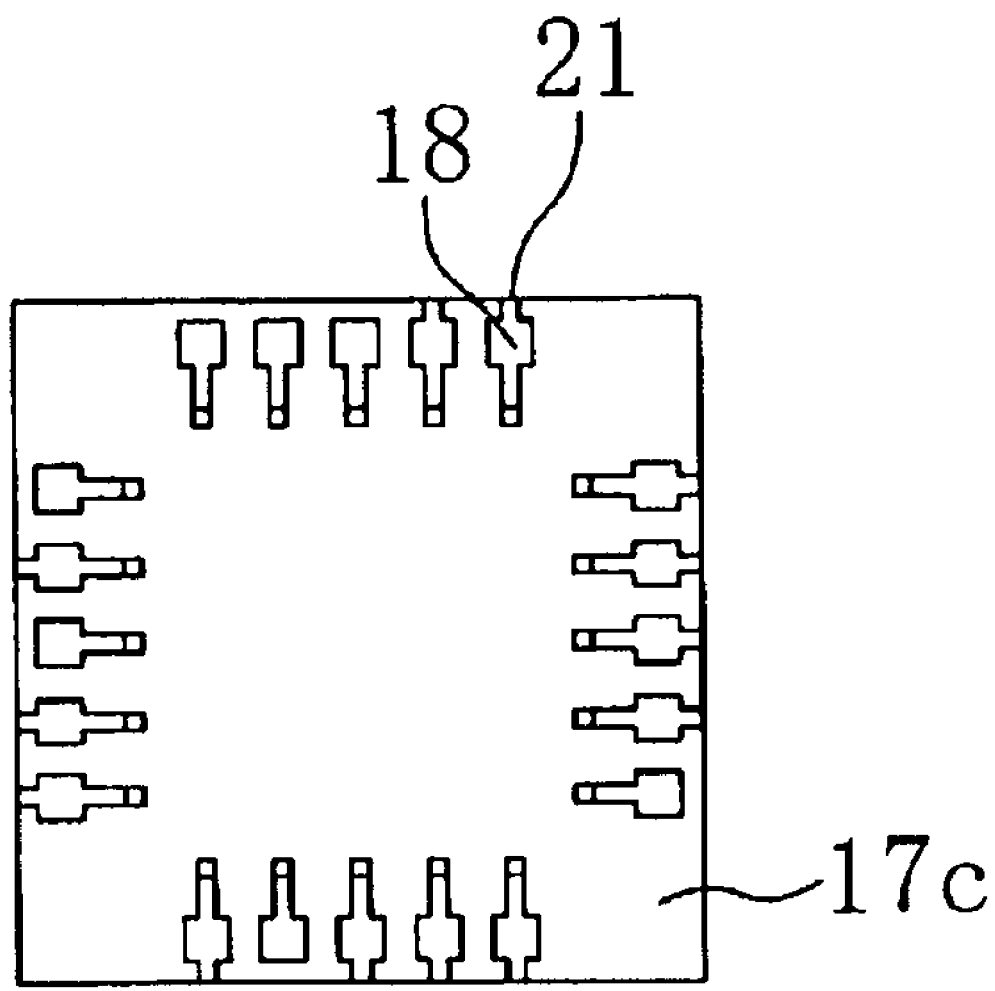
FIG. 2 is a plan view illustrating a semiconductor chip of the present invention.

FIG. 2 is a plan view illustrating a semiconductor chip 17c cut out along the second separation line 20 by using a rotating blade.

As illustrated in FIG. 2, the cut-off area 17b in which the probe pads 19 are formed has been removed, with the integrated circuit (not shown), the electrode pads 18 and the wires 21 remaining on the semiconductor chip 17c. Moreover, a section of the wire 21 is exposed on the side surface of the semiconductor chip 17c.

With the semiconductor wafer 15 of the present embodiment, each bulk chip area 17 is inspected by contacting a probe to the probe pad 19, after which the cut-off area 17b having the probe pads 19, which are no longer needed after the inspection, is cut off and removed. Therefore, the size of the semiconductor chip area 17a is smaller than that of the conventional semiconductor chip area 2. Thus, the chip size of the semiconductor chip 17c obtained from the semiconductor wafer 15 of the present embodiment can be reduced to be smaller than that of the conventional semiconductor chip 2a.

Next, alternative examples of the bulk chip area 17 to be provided in the semiconductor wafer as described above will be described with reference to the drawings. FIG. 3A, FIG. 3B, FIG. 4A, FIG. 4B, FIG. 5A and FIG. 5B are plan views each illustrating an alternative example of the bulk chip area 17, which is to be the semiconductor chip 17c mounted on a semiconductor chip 22 (see FIG. 6A).

Figure 3A:
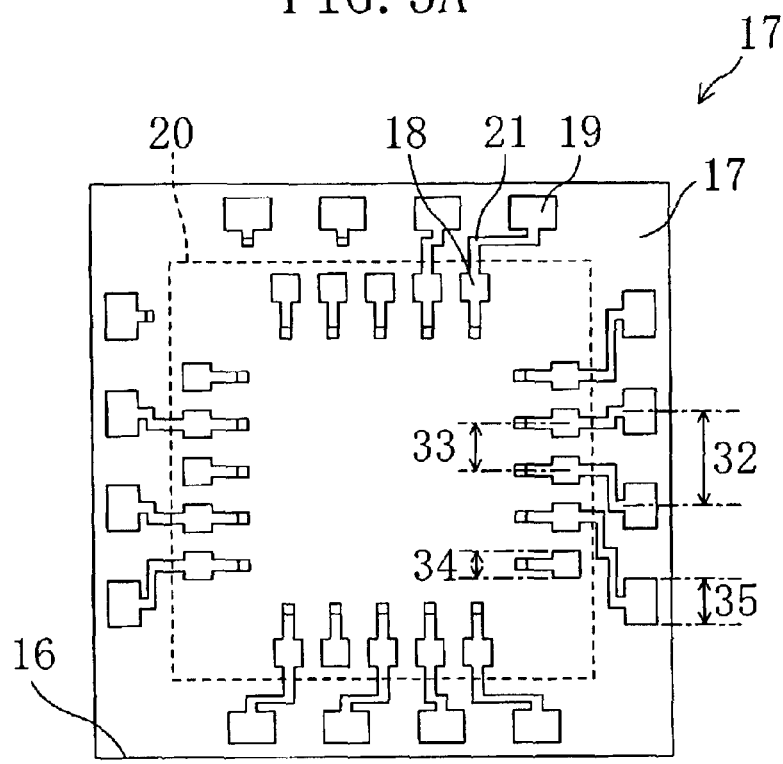
FIG. 3A and FIG. 3B are plan views each illustrating an alternative example of the semiconductor chip of the present invention.

In the bulk chip area 17 illustrated in FIG. 3A, an inspection circuit (not shown) for BIST, or the like, is provided within the semiconductor chip area 17a. In this way, the number of probe pads 19 in each cut-off area 17b can be smaller than the number of electrode pads 18. For example, in a semiconductor device 100 (see FIG. 6B) of the present embodiment, the semiconductor chip 17c may be a DRAM, and the semiconductor chip 22 may include a logic circuit. In such a case, in the bulk chip area 17 illustrated in FIG. 3A, the number of electrode pads 18 required is about 140, whereas the number of probe pads 19 that are required as data line pads, address line pads, control pads, power supply pads, etc., is about 50.

Thus, by reducing the number of probe pads 19, a pitch 32 of the probe pads 19 can be larger than a pitch 33 of the electrode pads 18. For example, assuming that the semiconductor chip area 17a has an area of 20 mm² (4 mm×5 mm), about 200 electrode pads 18 can be arranged in the semiconductor chip area 17a with the pitch 33 of the electrode pads 18 being 80 μm. In contrast, the probe pads 19 can be arranged with the pitch 32 being 300 μm, assuming that the semiconductor chip area 17a has an area of 20 mm². Furthermore, since the pitch 32 of the probe pads 19 can be large as described above, a width 35 of the probe pad 19 can be larger than a width 34 of the electrode pad 18. Therefore, in a case where the width 34 of the electrode pad 18 is set to be 50 μm, for example, the width 35 of the probe pad 19 can be 250 μm.

Moreover, each probe pad 19 may be formed in a rectangular shape and arranged so that the longer side of the probe pad 19 is parallel to the side of the bulk chip area 17 along which the probe pad 19 extends, as illustrated in FIG. 3A. In this way, the shape of the probe pad 19 can be elongated in the direction in which the probe is slid to scrub the probe pad 19 during a probing process (i.e., the direction parallel to the side of the bulk chip area 17 along which the probe pad 19 extends), while avoiding an increase in the size of the bulk chip area 17. Thus, the inspection can be more reliable.

Figure 3B:
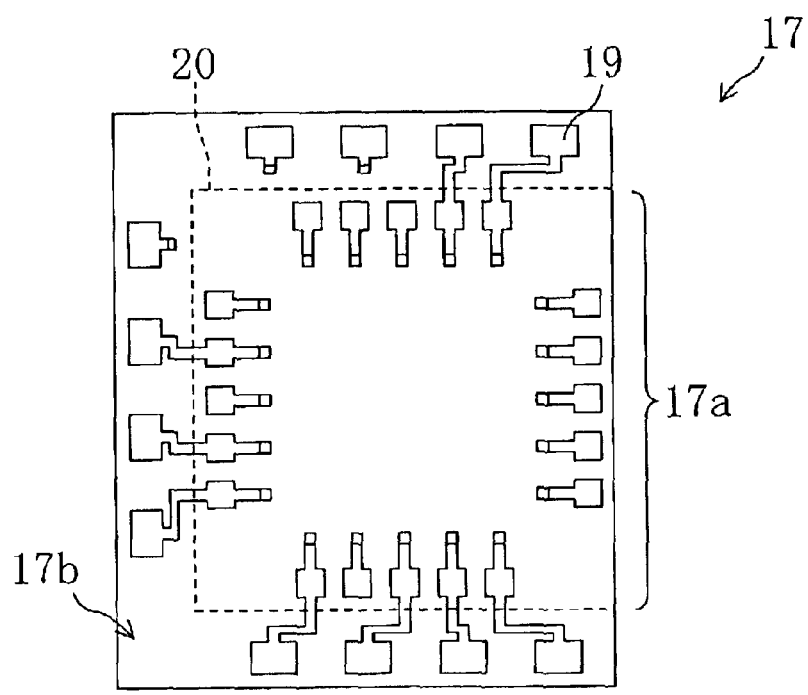
Figure 4A:
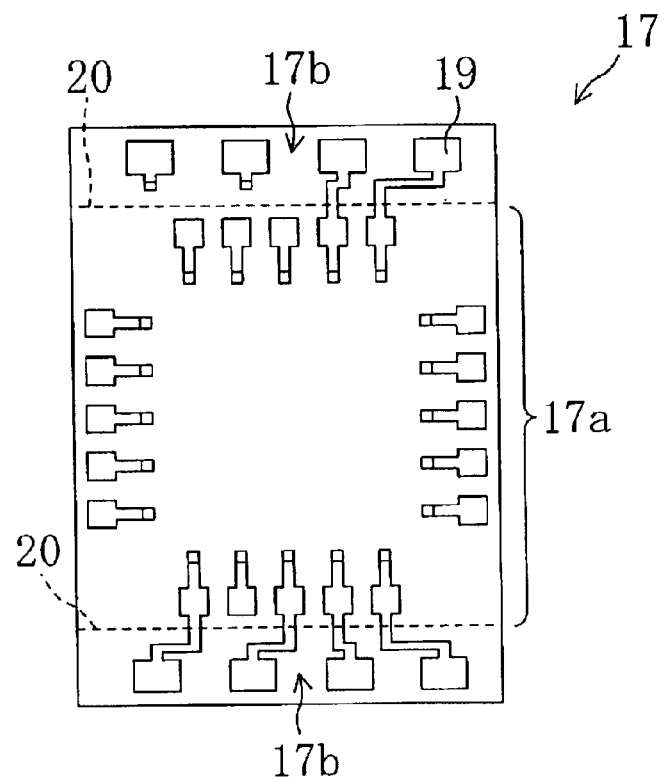
FIG. 4A and FIG. 4B are plan views each illustrating an alternative example of the semiconductor chip of the present invention.
Figure 4B:
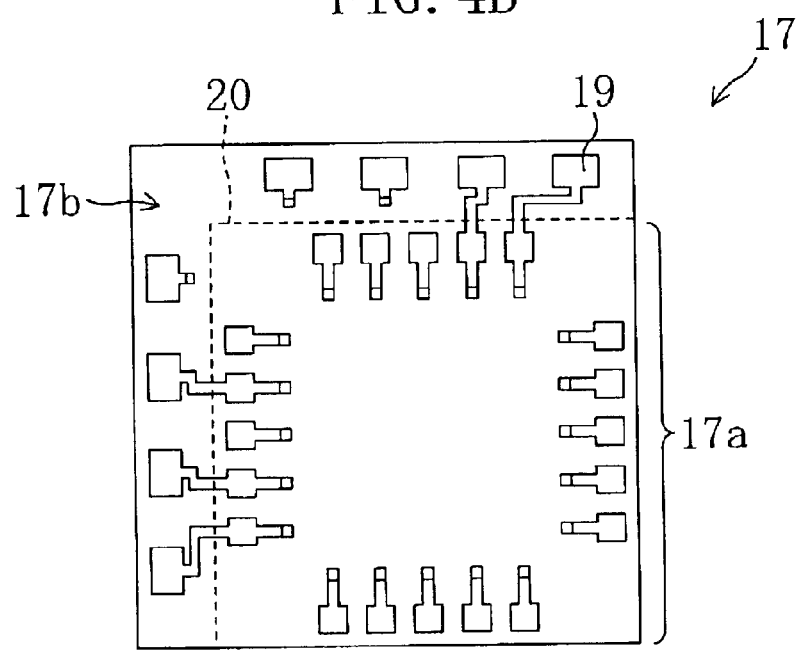
Figure 5A:
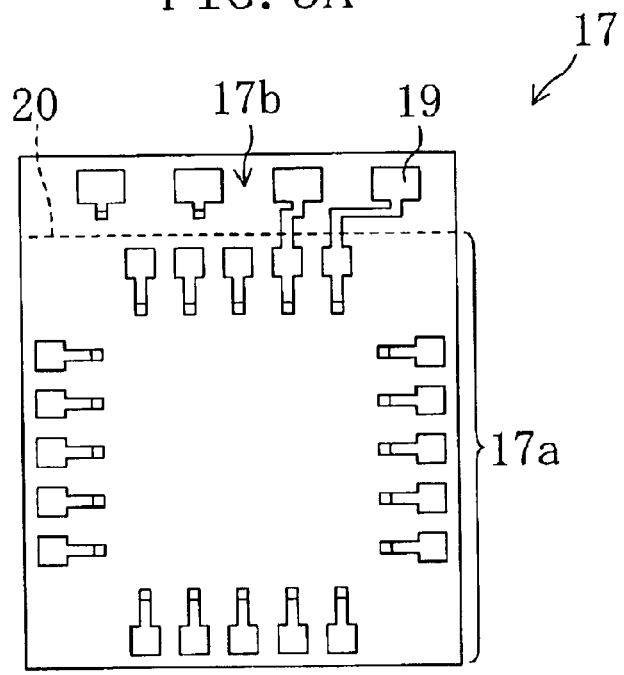
FIG. 5A and FIG. 5B are plan views each illustrating an alternative example of the semiconductor chip of the present invention.

Furthermore, if the number of probe pads 19 is reduced, the probe pads 19 that are necessary can be arranged without using all of the four sides of the bulk chip area 17, as illustrated in FIG. 3B, FIG. 4A, FIG. 4B and FIG. 5A. The alternative examples of the bulk chip area 17 illustrated in FIG. 3B, FIG. 4A, FIG. 4B and FIG. 5A are structurally substantially the same as the bulk chip area 17 illustrated in FIG. 3A, except for the number of probe pads 19 and the position/shape of the cut-off area 17b in which the probe pads 19 are provided. Specifically, FIG. 3B illustrates an example where the cut-off area 17b in which the probe pads 19 are provided extends along three sides of the bulk chip area 17. FIG. 4A and FIG. 4B each illustrate an example where the cut-off area 17b extends along two sides of the bulk chip area 17. FIG. 5A illustrates an example where the cut-off area 17b extends along one side of the bulk chip area 17.

In the example illustrated in FIG. 5A, assuming that the size of the bulk chip area 17 is 5 mm×4.15 mm and the pitch of the probe pads 19 is 90 μm, for example, about 50 probe pads 19 in which the width 35 is 80 μm can all be arranged in the cut-off area 17b extending along one side of the bulk chip area 17.

Thus, the reduction in the number of probe pads 19 makes it possible to reduce the area of the cut-off area 17b to be removed when the semiconductor chip 17c is cut out from the semiconductor chip area 17a along the second separation line 20. In this way, it is possible to increase the number of semiconductor chips 17c that can be obtained from one semiconductor wafer 15, and to reduce the manufacturing cost of the semiconductor chip 17c.

Moreover, in the present embodiment, the size of the probe pad 19 can be substantially larger than the size of the electrode pad 18 as described above. Since the probe pads 19 are cut off and removed, it is not necessary to take into consideration the capacitance and the inductance of the probe pads 19. In contrast, in the conventional semiconductor chip 2a, the electrode pad 4 functions also as a probe pad, and it is difficult to reduce the size of the electrode pad 4. Therefore, the capacitance and the inductance due to the electrode pads 18 of the semiconductor chip 17c of the present embodiment are significantly smaller than those due to the electrode pads 4 of the conventional semiconductor chip 2a. Assuming that the size of each electrode pad 4 of the conventional semiconductor chip 2a is 75 μm×75 μm and the size of each electrode pad 18 of the semiconductor chip 17c of the present embodiment is 15 μm×15 μm, for example, the area of the electrode pads is reduced to ⅟25, and the capacitance due to the electrode pads is reduced by 0.1 pF or more for the entire semiconductor chip area.

Moreover, in the present embodiment, an inspection circuit (not shown) for BIST, or the like, is provided within the semiconductor chip area 17a. Therefore, some of the electrode pads 18 are used only for the purpose of connection and are not probed. Each of such electrode pads 18 that are used only for the purpose of connection can be located so as to minimize the distance from the integrated circuit. In this way, the total length of wires that connect electrode pads to the integrated circuit can be reduced, thereby reducing the capacitance and the inductance due to the wires. The conventional semiconductor chip 2a includes wires for connecting the electrode pads 4 that are located along the periphery of the semiconductor chip 2a with the integrated circuit. Specifically, the capacitance of the semiconductor chip 17c of the present embodiment is reduced by 0.1 pF or more per unit wire length of 1 mm, as compared with that of the conventional semiconductor chip 2a.

As described above, according to the present embodiment, it is possible to obtain a semiconductor chip in which the influence of the capacitance and the inductance is very small.

Figure 5B:
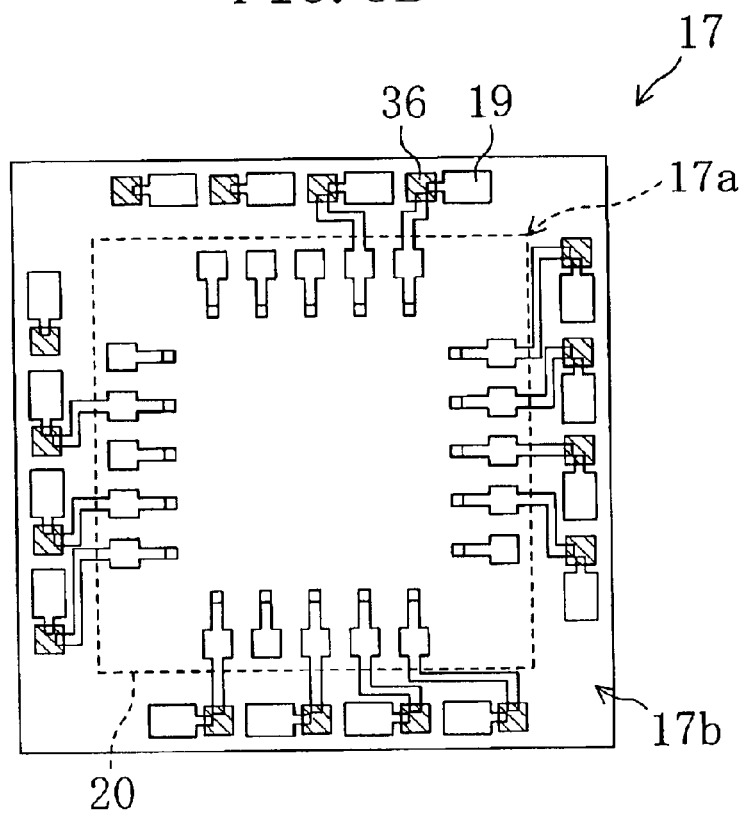

Moreover, in the present embodiment, a protection circuit 36 for protecting the integrated circuit from a surge entering from outside the bulk chip area 17 during a probing process may be provided in the cut-off area 17b. For example, the protection circuit 36 is arranged beside each probe pad 19, as illustrated in FIG. 5B. In this way, it is possible to further reduce the size of the semiconductor chip 17c obtained by separating the semiconductor chip areas 17a from one another along the second separation line 20. Moreover, since the protection circuits 36 are also cut off and removed, the capacitance and the inductance of the protection circuits 36 can be ignored.

Note that since an electrode pad for flip chip bonding is connected by using a bump electrode, the electrode pad 18 can be formed to be smaller than a square of 70 μm×70 μm. Moreover, since flip chip bonding applies only a small mechanical stress to an area directly under an electrode pad, a wire or a diffusion layer can be arranged directly under the electrode pad 18. Therefore, according to the present embodiment, the capacitance and the inductance of the electrode pads 18, the bump electrodes and the wires can be minimized.

As described above, according to the present embodiment, the bulk chip area 17 of the semiconductor wafer 15 is designed with a structure such that the probe pads 19 and the electrode pads 18 are provided separately, where the probe pads 19 are cut off and removed. In this way, it is possible to eliminate many of the restraints on the wiring design, such as the number, size, pitch, etc., of the probe pads and the electrode pads to be formed in a bulk chip area. Moreover, it is also possible to eliminate many of the other restraints on the wiring design, such as the arrangement of wires to be connected to the electrode pads, the arrangement of the electrode pads.

Figure 6A:
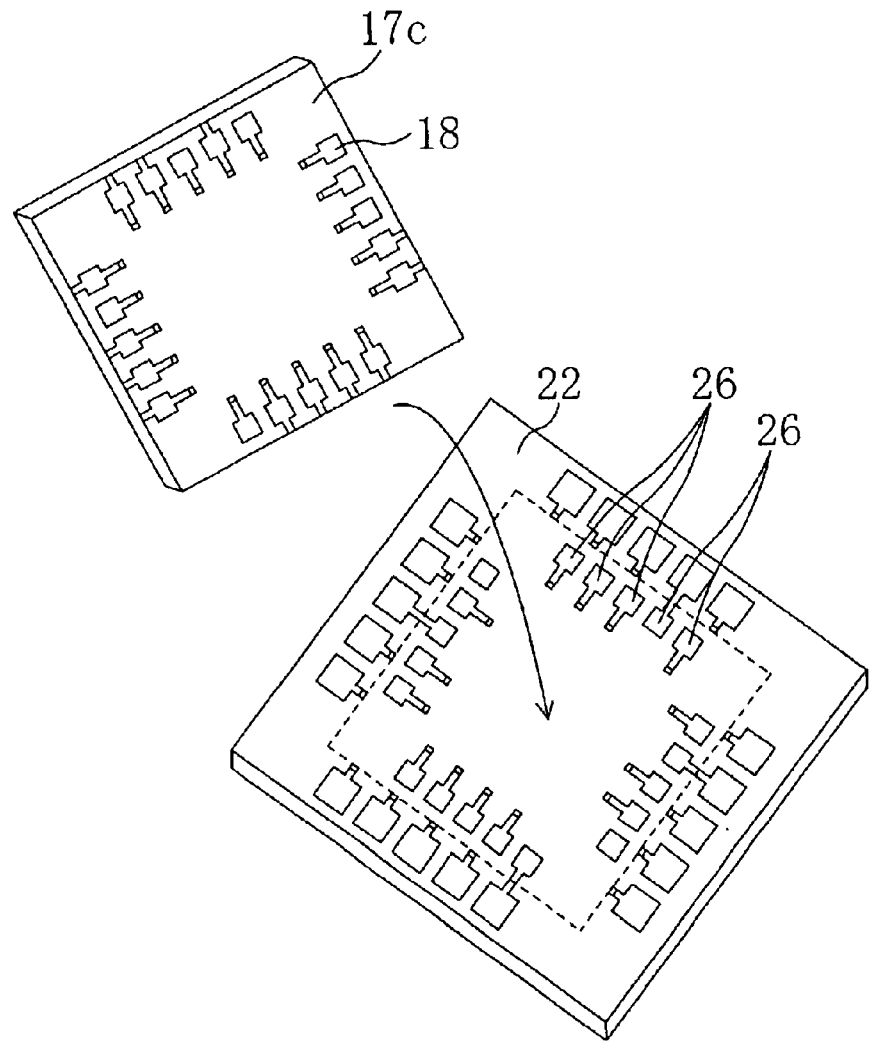
FIG. 6A and FIG. 6B are diagrams illustrating the structure of a semiconductor device of the present invention.

Next, the semiconductor device 100 of the present embodiment using a semiconductor chip obtained from a semiconductor wafer as described above will be described with reference to FIG. 6A and FIG. 6B. FIG. 6A is a diagram illustrating the semiconductor chip 17c, which has been cut out from the semiconductor wafer 15, being mounted on the other semiconductor chip 22 during the production of the semiconductor device 100 of the present embodiment, and FIG. 6B is a cross-sectional view of the semiconductor device 100 of the present embodiment.

As illustrated in FIG. 6A, in the semiconductor device 100 of the present embodiment, the semiconductor chip 17c, which has been cut out along the second separation line 20, is mounted facedown on the semiconductor chip 22.

Figure 6B:
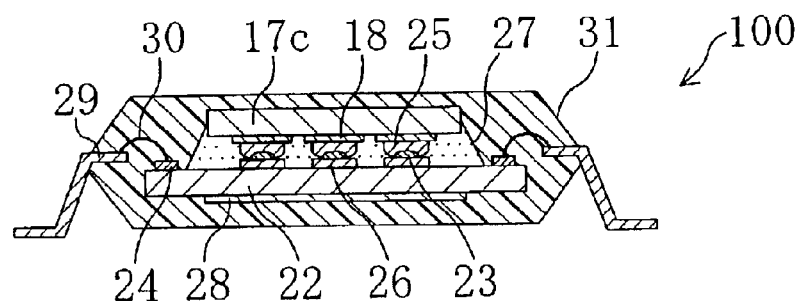

As illustrated in FIG. 6A and FIG. 6B, the semiconductor chip 22 includes internal electrode pads 26 and external electrode pads 24 formed on the upper surface thereof, and the semiconductor chip 22 further includes an internal circuit (not shown) connected to the internal electrode pads 26 and the external electrode pads 24. A bump electrode 23 is formed on each internal electrode pad 26. In the illustrated example, a bump electrode 25 is formed also on the upper surface of each electrode pad 18 of the semiconductor chip 17c. In the semiconductor device 100 of the present embodiment, the semiconductor chip 22 and the semiconductor chip 17c are attached together by flip chip bonding, with the bump electrodes 23 being connected to the bump electrodes 25.

In the present embodiment, the bump electrode 25 formed on the upper surface of the electrode pad 18 of the semiconductor chip 17c is made of a tin-silver alloy. The composition of the tin-silver alloy is such that the amount of silver is 3.5% with respect to that of tin, and the thickness of the tin-silver alloy is about 30 μm. The tin-silver alloy may further contain copper and/or bismuth. Moreover, the bump electrode 25 may be formed by using a tin-lead alloy, tin or indium, instead of using the tin-silver alloy.

Moreover, in the present embodiment, an under barrier metal layer (not shown) is formed on the electrode pads 18 for improving the adhesion between the electrode pads 18 of the bulk chip area 17 and the bump electrodes 25 and for preventing metal diffusion. The under barrier metal layer is made of a layered film obtained by depositing titanium, copper, nickel and a tin-silver alloy in this order from the electrode pad 18 side.

Moreover, while the bump electrode 23 is made of a nickel film in the present embodiment, it may alternatively be made of a tin-silver alloy, a tin-lead alloy, tin, indium, gold or copper. While the thickness of the nickel film is about 8 μm in the present embodiment, a gold foil having a thickness of about 0.05 μm may be formed on the surface of the nickel film for preventing oxidization.

As illustrated in FIG. 6B, the space between the semiconductor chip 22 and the semiconductor chip 17c is filled with an insulative resin 27. In the present embodiment, the insulative resin 27 is made of an epoxy thermosetting resin, and has a viscosity of 0.3 to 10 Pa·s at room temperature. Note that a spherical filler may be added to the material of the insulative resin 27 for ensuring the characteristics of the insulative resin 27 after being set. Moreover, the material of the insulative resin 27 may alternatively be an acrylic resin or a phenolic resin.

The semiconductor chip 22 is fixed to a die pad 28 of the lead frame. Moreover, the external electrode pad 24 of the semiconductor chip 22 is electrically connected to an inner lead 29 of the lead frame via a thin metal wire 30. The semiconductor chip 22, the semiconductor chip 17c, the die pad 28, the inner lead 29 and the thin metal wire 30 are encapsulated by an encapsulation resin 31.

As described above, with the present embodiment, the chip size of the semiconductor chip 17c obtained from the semiconductor wafer 15 is smaller than that of the conventional semiconductor chip 2a. Therefore, with the semiconductor device 100 of the present embodiment, it is possible to reduce the size of the semiconductor chip 22. Thus, according to the present embodiment, it is possible to obtain a semiconductor device that is smaller than the conventional semiconductor device 200.

Moreover, according to the present embodiment, one of the examples illustrated in FIG. 3A to FIG. 5B may be employed as the semiconductor chip 17c, thereby reducing the manufacturing cost of the semiconductor device.

Furthermore, according to the present embodiment, it is possible to obtain a semiconductor device in which the influence of the capacitance and the inductance of the semiconductor chip 17c is very small.

Next, the structure of the probe pad 19, the electrode pad 18 and the wiring layers in the bulk chip area 17 will be described. FIG. 7A to FIG. 7C and FIG. 8 are cross-sectional views each illustrating the structure of the probe pad 19, the electrode pad 18 and the wiring layers in the bulk chip area 17.

Figure 7A:
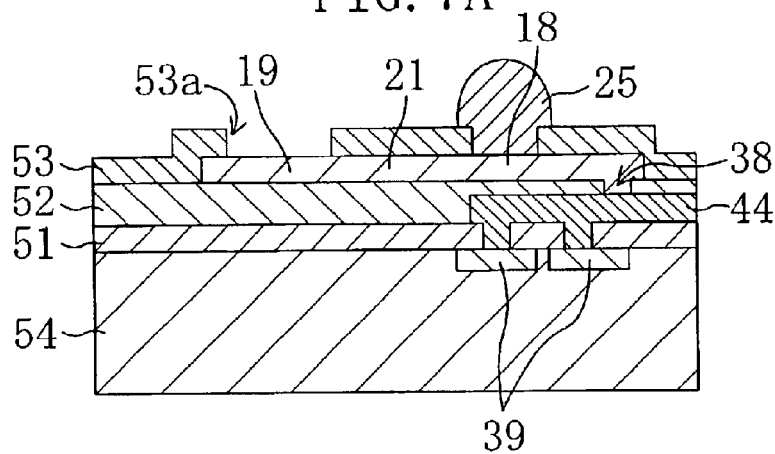
FIG. 7A to FIG. 7C are cross-sectional views each illustrating the structure of a probe pad, an electrode pad and wiring layers of a semiconductor chip.

As illustrated in FIG. 7A, in the bulk chip area 17 of the present embodiment, a substrate 54 having a diffusion layer 39 formed on the upper surface thereof, and insulative films 51, 52 and 53, are provided. The probe pad 19 and the electrode pad 18 (bump electrode 25) are provided so as to be exposed through an opening 53a in the insulative film 53, and are connected together by a wire 21. The wire 21 is connected to a wire 44, which is connected to the diffusion layer 39 provided on the substrate 54, via a through hole 38 formed in the insulative film 52.

Figure 7B:
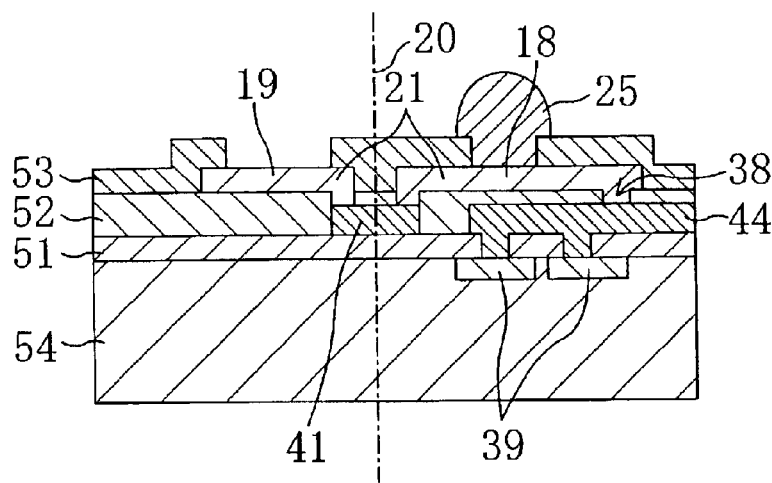

Alternatively, the wire 21 connecting the probe pad 19 with the electrode pad 18 (bump electrode 25) may be divided by the insulative films 52 and 53 into two portions that are connected together by a wire 41 made of polysilicon that is located directly under the second separation line 20, as illustrated in FIG. 7B. In this way, it is possible to suppress the occurrence of a burr after the cutting off with a blade and thus to prevent an electric short-circuit from occurring.

Figure 7C:
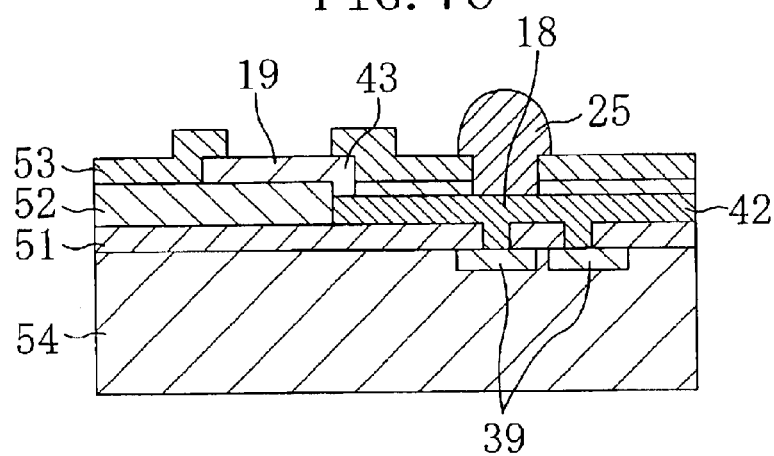

Alternatively, a wire 42 for connecting the electrode pad 18 (bump electrode 25) with the diffusion layer 39 may be formed in a wiring layer that is below the wiring layer in which a wire 43 for connecting the probe pad 19 with the electrode pad 18 is provided, as illustrated in FIG. 7C. In this way, the wiring length from the integrated circuit to the electrode pad 18 can be reduced as compared to the examples illustrated in FIG. 7A and FIG. 7B. Thus, the line capacitance can be reduced.

Figure 8:
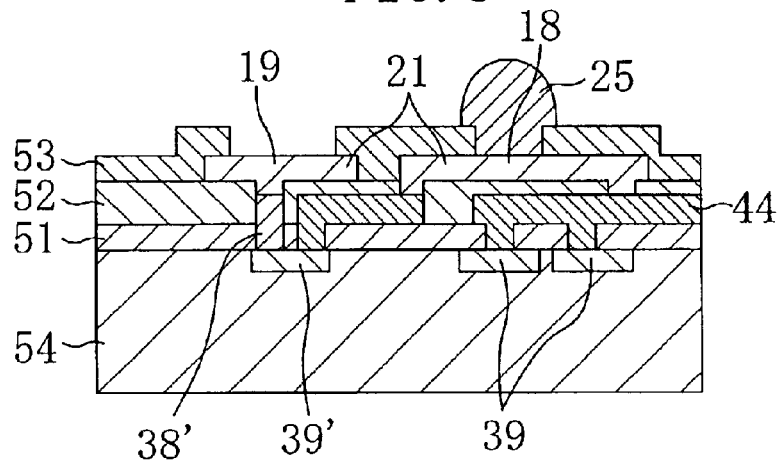
FIG. 8 is a cross-sectional view illustrating the structure of a probe pad, an electrode pad and wiring layers of a semiconductor chip.

Another alternative wiring structure is illustrated in FIG. 8, in which a diffusion layer 39' is formed directly under the probe pad 19, and the probe pad 19 and the diffusion layer 39' are connected directly to each other via a plug 38'.

Next, a method or manufacturing the semiconductor device of the present invention will be described with reference to FIG. 9A to FIG. 10D. FIG. 9A to FIG. 10D are cross-sectional views illustrating the steps of a method for manufacturing the semiconductor device of the present embodiment.

Figure 9A:
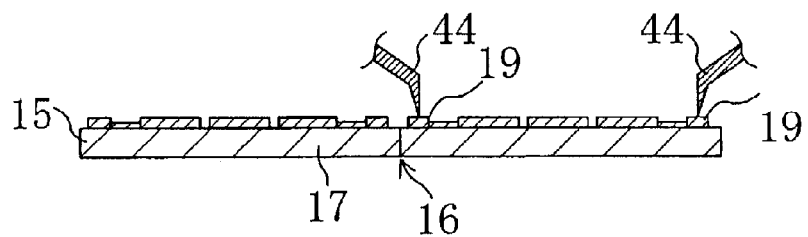
FIG. 9A to FIG. 9D are cross-sectional views illustrating steps of a method for manufacturing a semiconductor device of the present invention.

First, in the step shown in FIG. 9A, the semiconductor wafer 15 having a plurality of bulk chip areas 17 that are partitioned from one another by the first separation line 16 is prepared. An integrated circuit (not shown), the electrode pads 18 and the probe pads 19 are formed in each bulk chip area 17. Some of the probe pads 19 are connected to the electrode pads 18 each via the wire 21 that runs across the second separation line 20. Then, each bulk chip area 17 is inspected by contacting a probe 44 to each probe pad 19 on the upper surface of the semiconductor wafer 15.

Figure 9B:
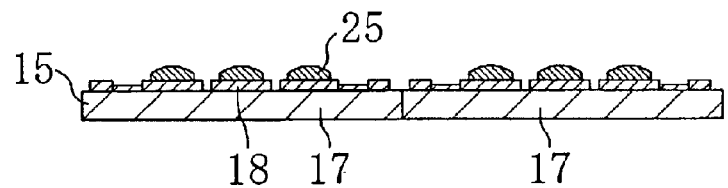

Then, in the step shown in FIG. 9B, the bump electrodes 25 are formed on the electrode pads 18 on the upper surface of the bulk chip areas 17 formed in the semiconductor wafer 15. In this example, the bump electrode 25 is made of a tin-silver alloy, which is a molten metal material. The composition of the tin-silver alloy is such that the amount of silver is 3.5% with respect to that of tin, and the thickness of the tin-silver alloy is about 30 μm. For example, possible methods for forming the bump electrodes 25 made of a tin-silver alloy include an electroplating method, an electroless plating method, a printing method, a dipping method, and a stud bump method. Moreover, a layered film including titanium, copper, nickel and a tin-silver alloy, which are deposited in this order, is formed as an under barrier metal layer (not shown) on the electrode pad 18 for improving the adhesion between the electrode pad 18 and the bump electrode 25 and for preventing metal diffusion. Note that the tin-silver alloy may further contain copper and/or bismuth. Moreover, the bump electrode 25 may be formed by using a tin-lead alloy, tin or indium, instead of using the tin-silver alloy.

Figure 9C:
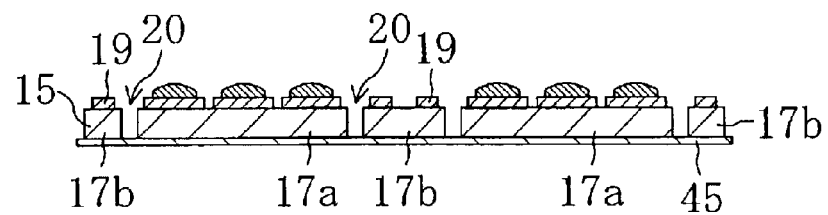

Then, in the step shown in FIG. 9C, a dicing tape 45 is attached to the lower surface of the semiconductor wafer 15, after which the semiconductor wafer 15 is diced by using a rotating blade along the second separation line 20, thereby separating the cut-off area 17b in which the probe pads 19 are formed from the semiconductor chip area 17a in which the electrode pads 18 and the integrated circuit (not shown) are formed. Thus, the semiconductor chip 17c is obtained.

Figure 9D:

Then, in the step shown in FIG. 9D, the semiconductor chip 17c is picked up.

Figure 10A:
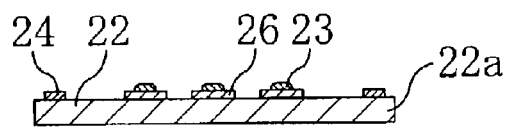
FIG. 10A to FIG. 10D are cross-sectional views illustrating steps of the method for manufacturing a semiconductor device of the present invention.

Then, in the step shown in FIG. 10A, a semiconductor wafer (not shown) having a plurality of bulk chip areas 22a to be divided along a separation line (not shown) into the semiconductor chips 22 is prepared. Note that only one bulk chip area 22a is shown in the figure for the sake of simplicity. The bulk chip area 22a has formed therein the internal electrode pads 26 and the external electrode pads 24 formed on the upper surface thereof, and an internal circuit (not shown) connected to the internal electrode pads 26 and the external electrode pads 24. Then, the bump electrode 23 is formed on each internal electrode pad 26 on the upper surface of the bulk chip area 22a. In the present embodiment, the bump electrodes 23 are formed by using a nickel film. The thickness of the nickel film is about 8 μm, and a gold foil having a thickness of about 0.05 μm may be formed on the surface of the nickel film for preventing oxidization. For example, possible methods for forming the bump electrodes 25 made of nickel and gold include an electroplating method, an electroless plating method, a printing method, a dipping method, and a stud bump method. Moreover, in addition to nickel, molten metal materials that can be used for forming the bump electrodes 23 include a tin-silver alloy, a tin-lead alloy, tin, indium, gold and copper.

Figure 10B:
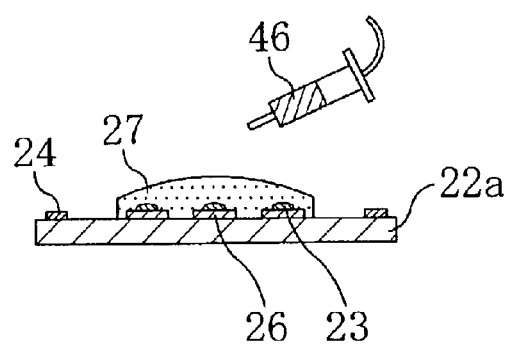

Then, in the step shown in FIG. 10B, the insulative resin 27 is applied on the upper surface of the bulk chip area 22a. In the present embodiment an epoxy thermosetting resin is applied as the material of the insulative resin 27. It is preferred that the material of the insulative resin 27 has a viscosity of 0.3 to 10 Pa·s at room temperature. Note that a spherical filler may be added to the material of the insulative resin 27 for ensuring the characteristics of the insulative resin 27 after being set. Moreover, the material of the insulative resin 27 may alternatively be an acrylic resin or a phenolic resin, and it may be any of a thermosetting resin, a thermoplastic resin, a two-part cold setting resin, and a combination of a UV curable resin and a thermosetting resin. As to the method for applying the insulative resin 27, the insulative resin 27 is dripped onto the bump electrode 23 of the bulk chip area 22a from a syringe 46 using a dispenser device, in the present embodiment. The dripping process may be performed through a plurality of iterations depending on the shape and size of the bulk chip area 22a. Alternatively, the insulative resin 27 may be applied by a transfer method or a printing method.

Figure 10C:
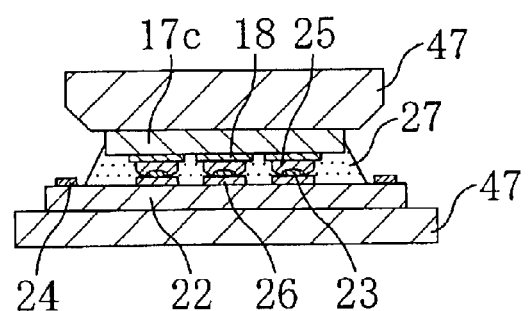

Then, in the step shown in FIG. 10C, the semiconductor chip 17c is pressed against the bulk chip area 22a while heating them to a temperature equal to or greater than the lower one of the melting point of the bump electrode 23 of the bulk chip area 22a and that of the bump electrode 25 of the semiconductor chip 17c. In this way, the melted bump electrode 23 or 25 is mechanically deformed, and the surface oxide film of the bump electrode 23 or 25 is broken, whereby the bump electrode 25 and the bump electrode 23 are easily attached together through metal diffusion.

In the present embodiment, the heating and pressing process is performed at 221 to 300° C. for 1 to 3 seconds by using a pulse heating tool 47. In a case where the bump electrode 23 of the bulk chip area 22a is made of a tin-lead alloy, it is preferred that the semiconductor chip 17c is attached to the bulk chip area 22a by performing the heating and pressing process at a temperature of 183 to 250° C. by using the pulse heating tool 47. In a case where the bump electrode 23 of the bulk chip area 22a is made of tin, it is preferred that the semiconductor chip 17c is attached to the bulk chip area 22a by performing the heating and pressing process at a temperature of 290 to 400° C. by using the pulse heating tool 47. In a case where the bump electrode 23 of the bulk chip area 22a is made of indium, it is preferred that the semiconductor chip 17c is attached to the bulk chip area 22a by performing the heating and pressing process at a temperature of 190 to 250° C. by using the pulse heating tool 47.

Then, after the application of the heat and the pressure from the pulse heating tool 47 is stopped, the insulative resin 27 is thermally set in a thermosetting furnace. Then, a dicing tape is attached to the lower surface of the semiconductor wafer, after which the semiconductor wafer is diced by using a rotating blade along the separation line 20, thereby separating the bulk chip areas 22a from one another. Thus, the semiconductor chip 22 to which the semiconductor chip 17c is attached is obtained.

Figure 10D:
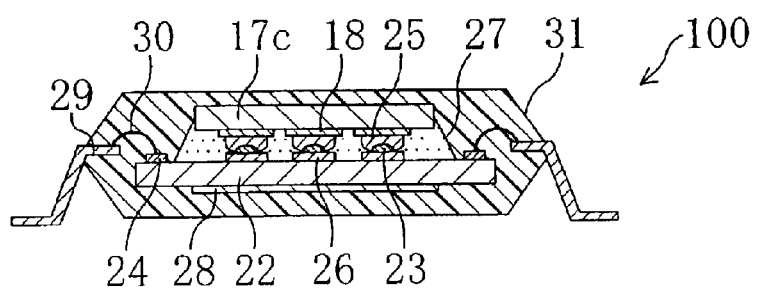
Figure 11A:
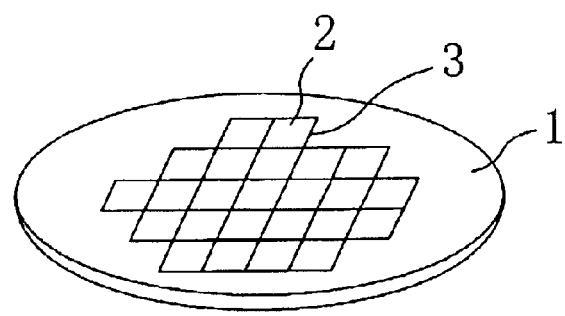
FIG. 11A is a schematic diagram illustrating a semiconductor wafer having formed therein a plurality of semiconductor chips.
Figure 11B:
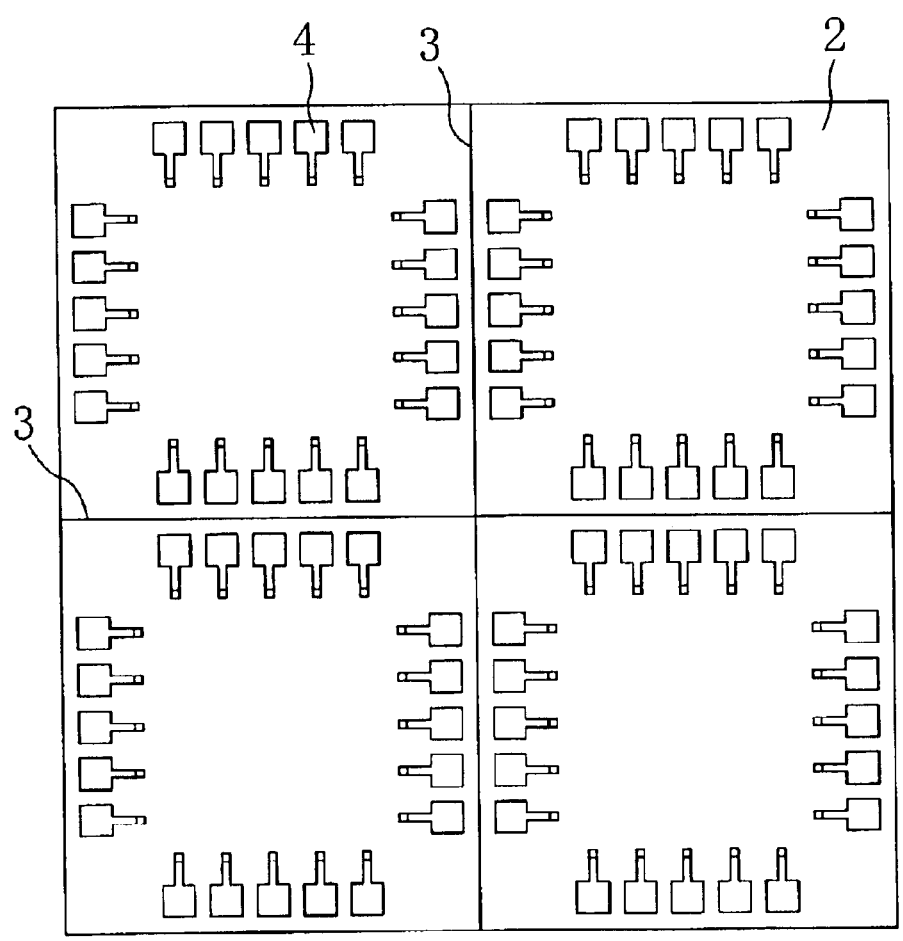
FIG. 11B is a plan view illustrating the upper surface of the semiconductor wafer of FIG. 11A on an enlarged scale.
Figure 12A:
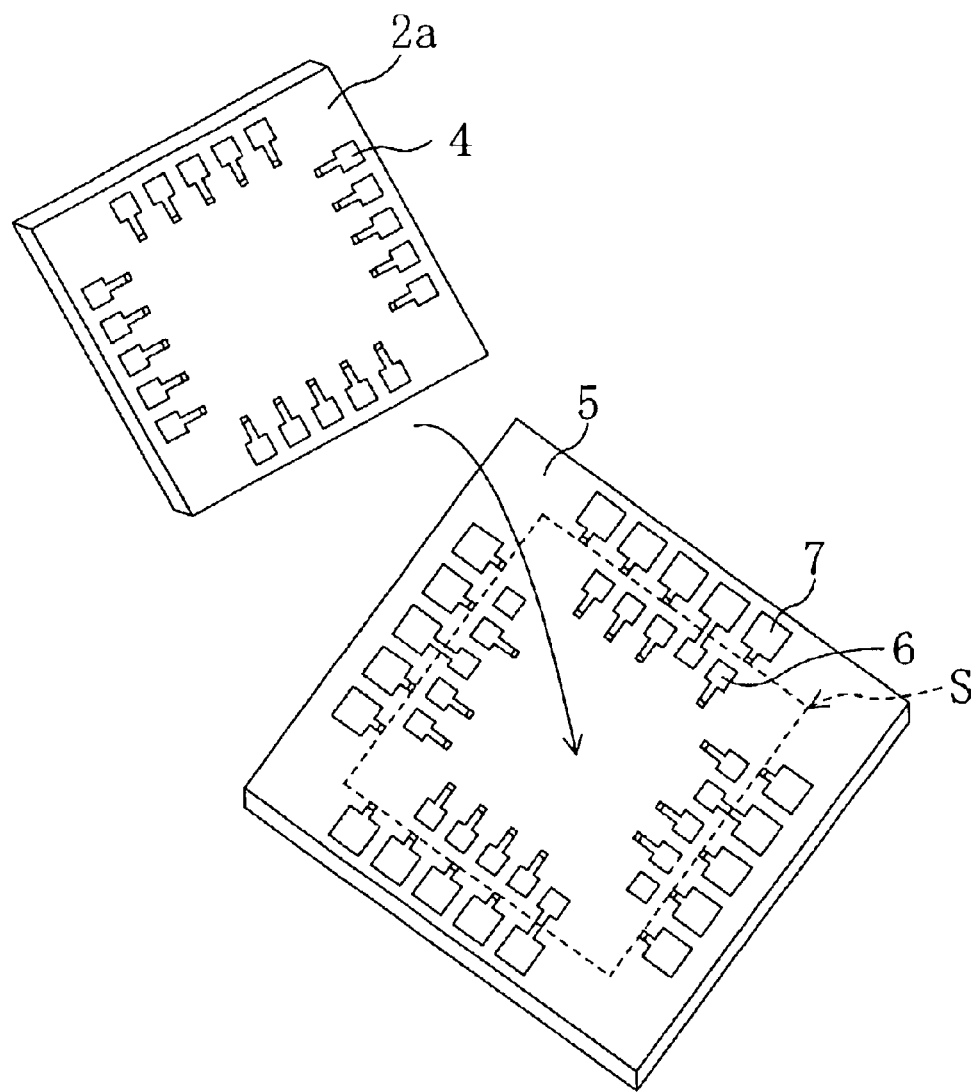
FIG. 12A and FIG. 12B illustrate the structure of a conventional semiconductor device.
Figure 12B:
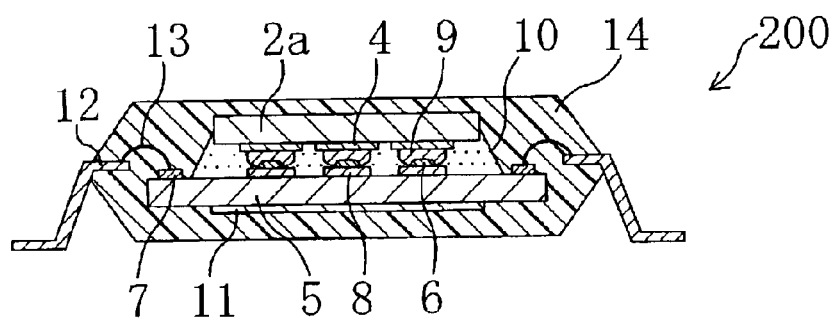

Then, as illustrated in FIG. 10D, the external electrode pad 24 of the semiconductor chip 22 is connected to the inner lead 29 of the lead frame via the thin metal wire 30, and then the semiconductor chip 17c, the semiconductor chip 22, the die pad 28, the inner leads 29 and the thin metal wires 30 are encapsulated by the encapsulation resin 31. Then, an outer lead of the lead frame protruding from the encapsulation resin 31 is shaped, thereby obtaining the semiconductor device 100.

Note that while the bulk chip areas 22a are separated from one another in the step shown in FIG. 10C in the present embodiment, the present invention is not limited to this. For example, the bulk chip areas 22a may alternatively be separated from one another to obtain the semiconductor chips 22 in the step shown in FIG. 10A, after which the step of FIG. 10B and the subsequent steps are performed as described above.

The COC type semiconductor device 100 of the present embodiment including the bulk chip area 17 and the semiconductor chip 22 may be mounted on a lead frame, a printed circuit board, etc., so as to obtain a semiconductor package.

Note that in the present embodiment, possible combinations of types of the semiconductor chip 17c and the semiconductor chip 22 include, for example, a combination of a semiconductor chip including a memory device such as a DRAM and a semiconductor chip including a logic circuit such as a microcomputer, a combination of semiconductor chips including different logic circuits, and a combination of a semiconductor chip produced by using a compound semiconductor substrate and a semiconductor chip produced by using a silicon substrate. Alternative combinations include a combination of semiconductor chips that are produced by different processes, and a combination of two semiconductor chips that are obtained by dividing a single large-area semiconductor chip produced by a single process.

According to the present invention, it is possible to provide a semiconductor device having a small size and a high performance.

What is claimed is:

1. A semiconductor device, comprising:
    a first semiconductor chip including a first integrated circuit, a first electrode pad connected to the first integrated circuit, and a first bump electrode formed on the first electrode pad;
    a second semiconductor chip including a second integrated circuit, a second electrode pad connected to the second integrated circuit, and a second bump electrode formed on the second electrode pad, wherein:
        a section of an inspection wire connected to the first electrode pad is exposed on a side surface of the first semiconductor chip; and
        the first bump electrode and the second bump electrode are electrically connected to each other.

2. The semiconductor device of claim 1, wherein a probe pad is not provided in the first semiconductor chip.

3. The semiconductor device of claim 1, wherein an external electrode pad for connection to an external circuit is formed along a periphery of the second semiconductor chip.

4. The semiconductor device of claim 1, wherein an insulative resin is provided between the first semiconductor chip and the second semiconductor chip.

5. The semiconductor device of claim 1, wherein the first semiconductor chip and the second semiconductor chip are encapsulated by an encapsulation resin.

6. A method for manufacturing a semiconductor device, comprising the steps of:
    (a) preparing a first semiconductor wafer, the first semiconductor wafer including: a plurality of first semiconductor chip areas each of which is to be a first semiconductor chip; and a cut-off area for separating the plurality of first semiconductor chip areas from one another so as to obtain the first semiconductor chips, wherein: a first integrated circuit and a first electrode pad connected to the first integrated circuit are provided in each of the first semiconductor chip areas; and a probe pad connected to the first electrode pad is provided in the cut-off area;
    (b) inspecting each of the first semiconductor chips by contacting a probe to the probe pad;
    (c) forming a first bump electrode on the first electrode pad;
    (d) removing the cut-off area of the first semiconductor wafer so as to obtain the first semiconductor chips from the first semiconductor chip areas;
    (e) preparing a second semiconductor wafer, the second semiconductor wafer including a plurality of second semiconductor chip areas each of which includes a second integrated circuit, and a second electrode pad connected to the second integrated circuit, and each of which is to be a second semiconductor chip;
    (f) forming a second bump electrode on the second electrode pad formed in each of the second semiconductor chip areas;
    (g) heating and pressing the first bump electrode and the second bump electrode against each other so as to electrically connect the first bump electrode and the second bump electrode to each other; and
    (h) cutting the second semiconductor wafer so as to separate the second semiconductor chip areas from one another.

7. The method for manufacturing a semiconductor device of claim 6, wherein in the step (g), an insulative resin is supplied between the first semiconductor chip and the second semiconductor chip.

8. The method for manufacturing a semiconductor device of claim 6, wherein in the step (c) and the step (f), the first bump electrode and the second bump electrode are formed by using one of an electroplating method, an electroless plating method, a printing method, a dipping method, and a stud bump method.

9. The method for manufacturing a semiconductor device of claim 6, wherein in the step (c), the first bump electrode is made of one of an alloy containing tin and silver, an alloy containing tin and lead, tin, nickel, copper, indium, and gold.

* * * * *